United States Patent
Cronin et al.

[11] Patent Number: 5,925,924
[45] Date of Patent: Jul. 20, 1999

[54] METHODS FOR PRECISE DEFINITION OF INTEGRATED CIRCUIT CHIP EDGES

[75] Inventors: John Edward Cronin, Milton; Wayne John Howell, Williston; Howard Leo Kalter; Patricia Ellen Marmillion, both of Colchester; Anthony Palagonia, Underhill; Bernadette Ann Pierson, South Hero; Dennis Arthur Schmidt, South Burlington, all of Vt.

[73] Assignee: International Business Machines Corporation, Armonk, N.Y.

[21] Appl. No.: 08/843,177

[22] Filed: Apr. 14, 1997

Related U.S. Application Data

[62] Division of application No. 08/507,186, Jul. 26, 1995, Pat. No. 5,691,248.

[51] Int. Cl.⁶ .................................................. H01L 29/06
[52] U.S. Cl. .................................... 257/622; 257/686
[58] Field of Search ............................ 257/622, 620, 257/686, 723

[56] References Cited

U.S. PATENT DOCUMENTS

| | | | |
|---|---|---|---|
| 4,325,182 | 4/1982 | Tefft et al. ................................. | 29/583 |
| 4,707,218 | 11/1987 | Giammarco et al. ................... | 156/643 |
| 4,822,755 | 4/1989 | Hawkins et al. ........................ | 437/227 |
| 4,925,808 | 5/1990 | Richardson ............................. | 437/62 |
| 4,990,462 | 2/1991 | Sliwa, Jr. ................................. | 437/51 |
| 5,075,253 | 12/1991 | Sliwa, Jr. ................................. | 437/209 |
| 5,104,820 | 4/1992 | Go et al. .................................. | 437/51 |
| 5,107,586 | 4/1992 | Eichelberger et al. ................... | 29/830 |
| 5,122,481 | 6/1992 | Nishiguchi ................................ | 437/225 |
| 5,162,251 | 11/1992 | Poole et al. .............................. | 437/53 |
| 5,270,261 | 12/1993 | Bertin et al. ............................. | 437/209 |
| 5,293,061 | 3/1994 | Hosaka ..................................... | 257/622 |
| 5,434,094 | 7/1995 | Kobiki et al. ..................... | 148/DIG. 28 |
| 5,478,781 | 12/1995 | Bertin et al. ............................. | 437/209 |
| 5,480,832 | 1/1996 | Miura et al. .............................. | 437/67 |
| 5,482,887 | 1/1996 | Duinkerken et al. ................... | 437/226 |
| 5,691,248 | 11/1997 | Cronin et al. ............................ | 438/977 |

FOREIGN PATENT DOCUMENTS

| | | | |
|---|---|---|---|
| 53-14560 | 9/1978 | Japan ................................... | 156/645.1 |
| 57-133647 | 8/1982 | Japan ................................... | 437/227 |
| 58-108748 | 6/1983 | Japan ................................... | 437/227 |
| 59-186345 | 10/1984 | Japan ................................... | 437/227 |
| 63-119536 | 5/1988 | Japan ................................... | 437/227 |

*Primary Examiner*—Mark V. Prenty
*Attorney, Agent, or Firm*—Heslin & Rothenberg, P.C.

[57] ABSTRACT

Integrated Circuit ("IC") chips are formed with precisely defined edges and sizing. At the wafer processing level, trenches are lithographically etched in the kerf regions to define the edges of the IC chips on the wafer. The trenches are filled with insulating material, and upper level wiring and metallization is completed for the IC chips on the wafer. Further trenches are defined down to the filled previously formed trenches. The wafer is thinned from its bottom up to the filled trenches, and the insulating material therein is removed to separate the individual IC chips from the wafer. The precision of IC chip edge definition facilitates forming the IC chips into stacks more easily because many stack level alignment processes become unnecessary.

4 Claims, 16 Drawing Sheets

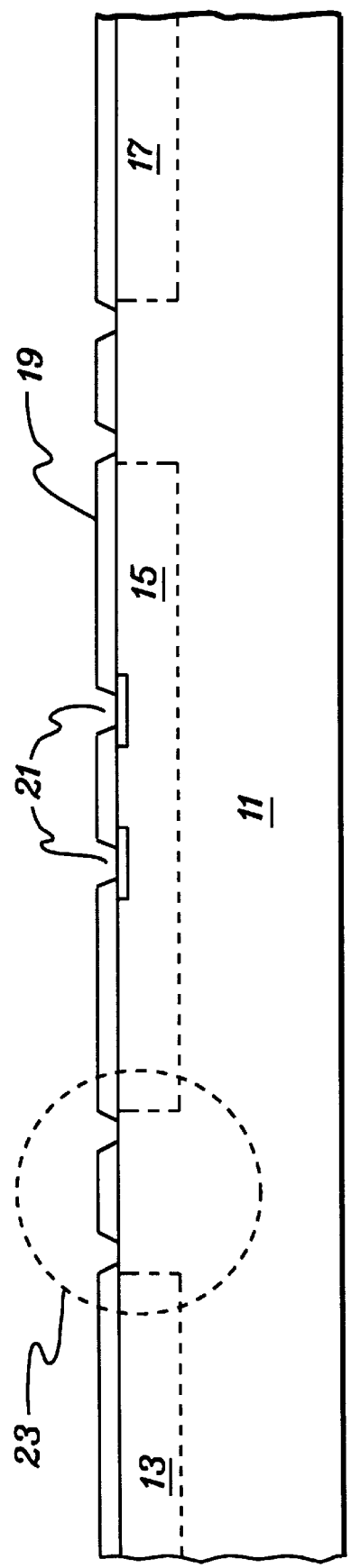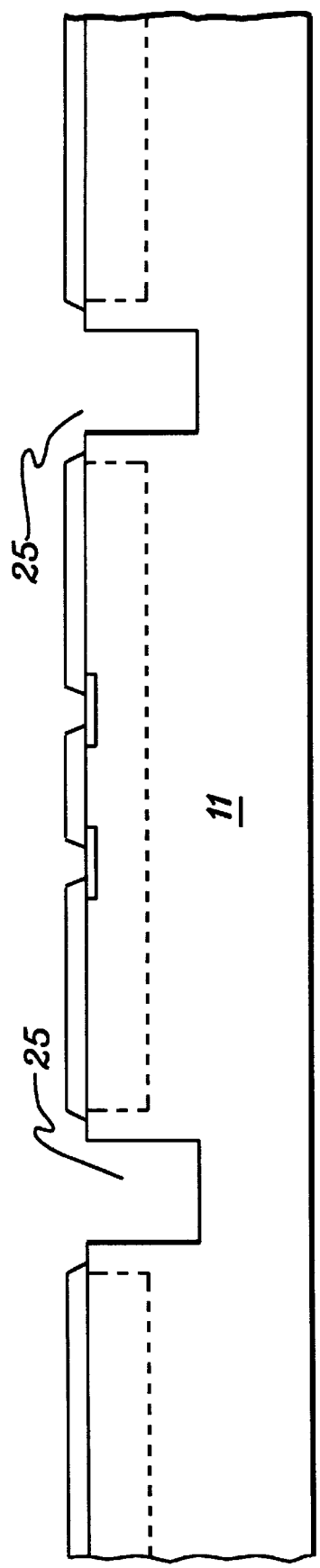

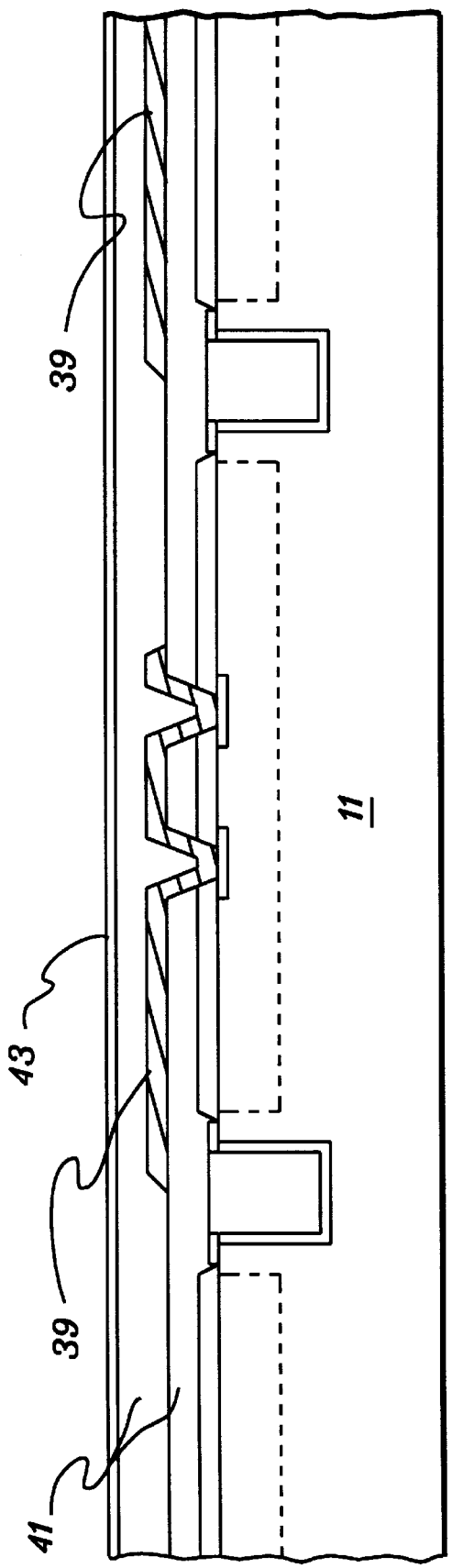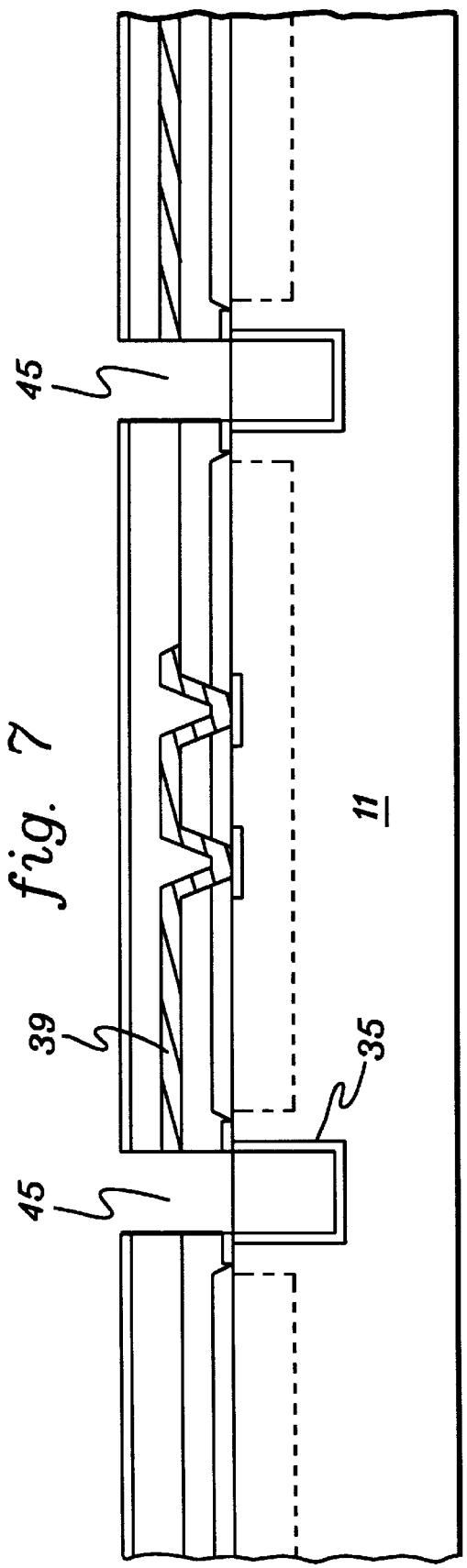

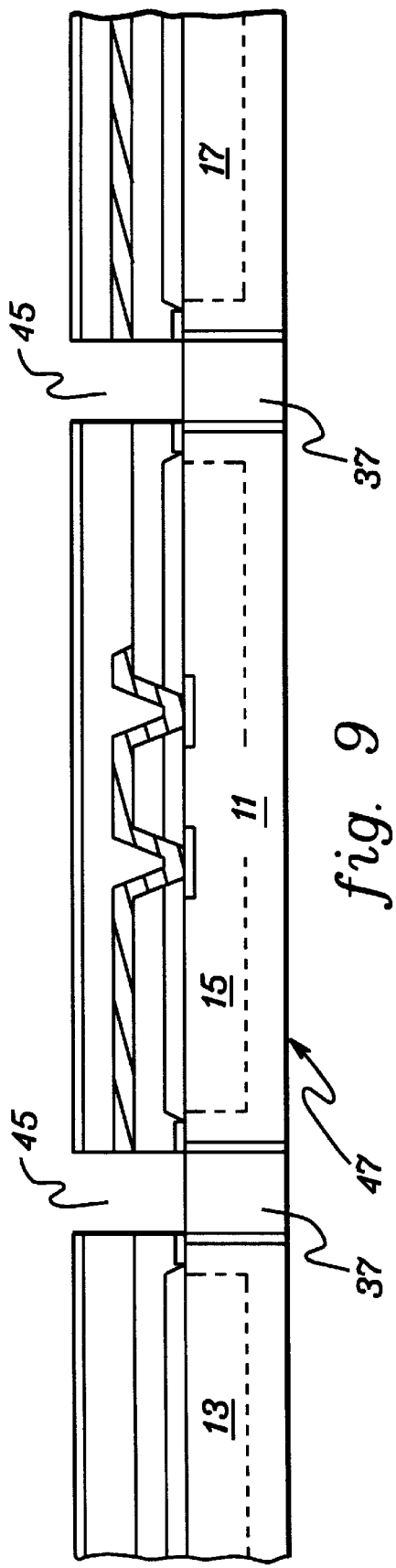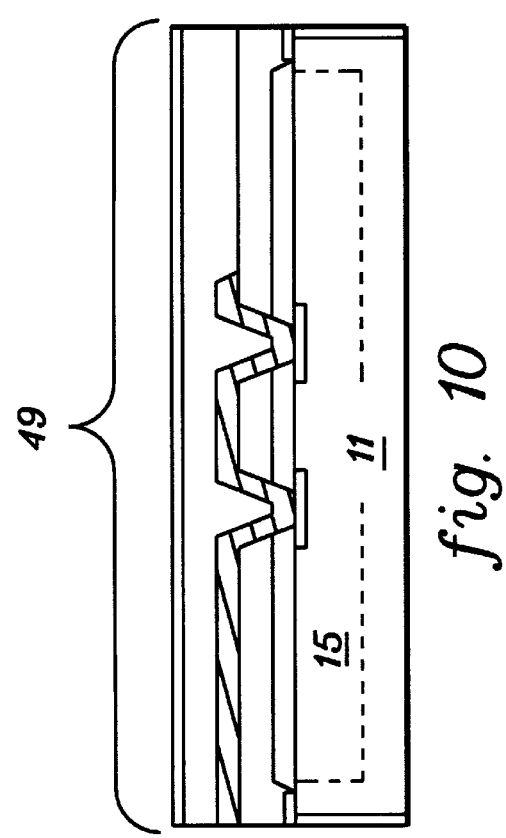
fig. 9
fig. 10

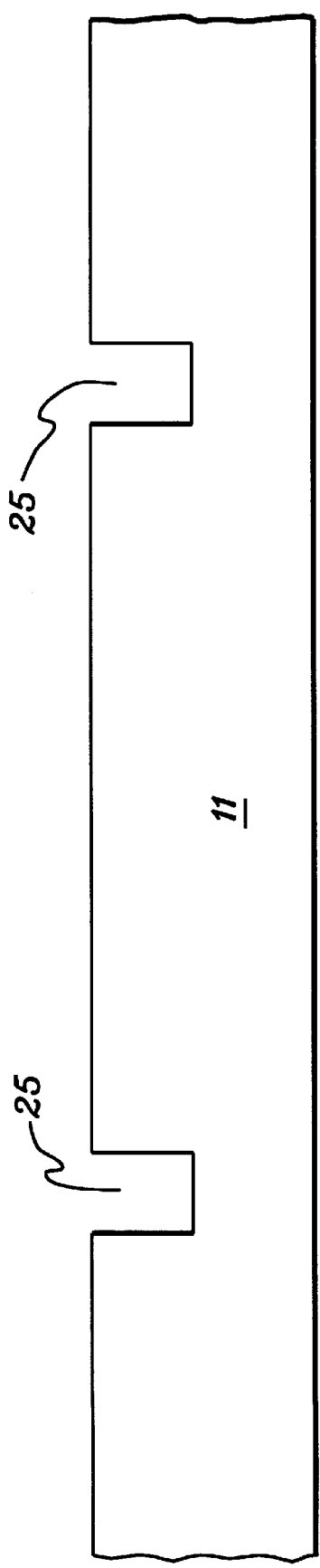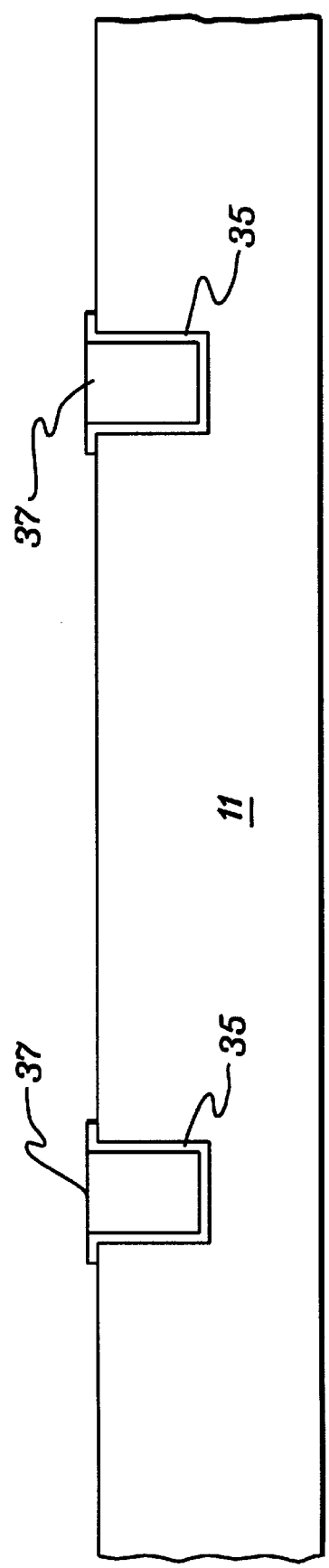

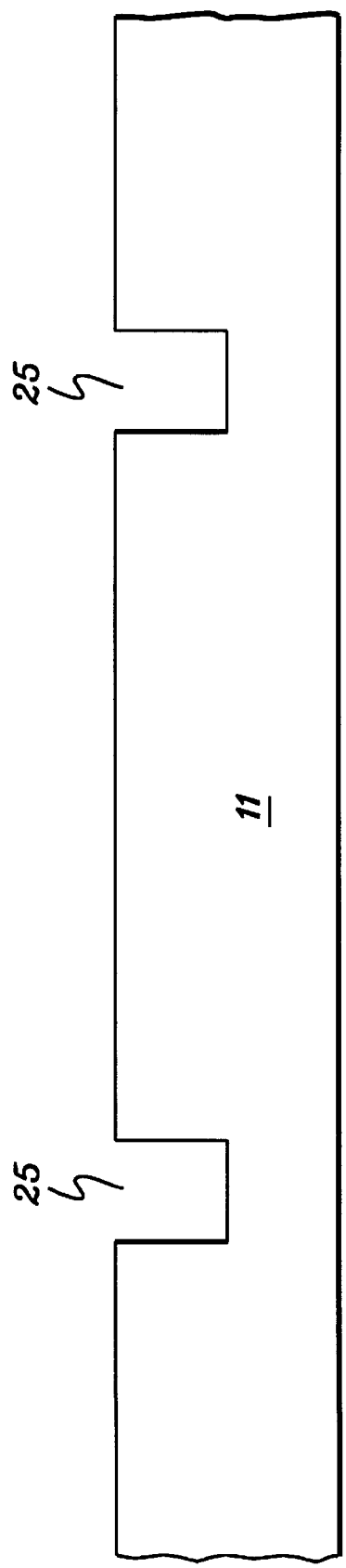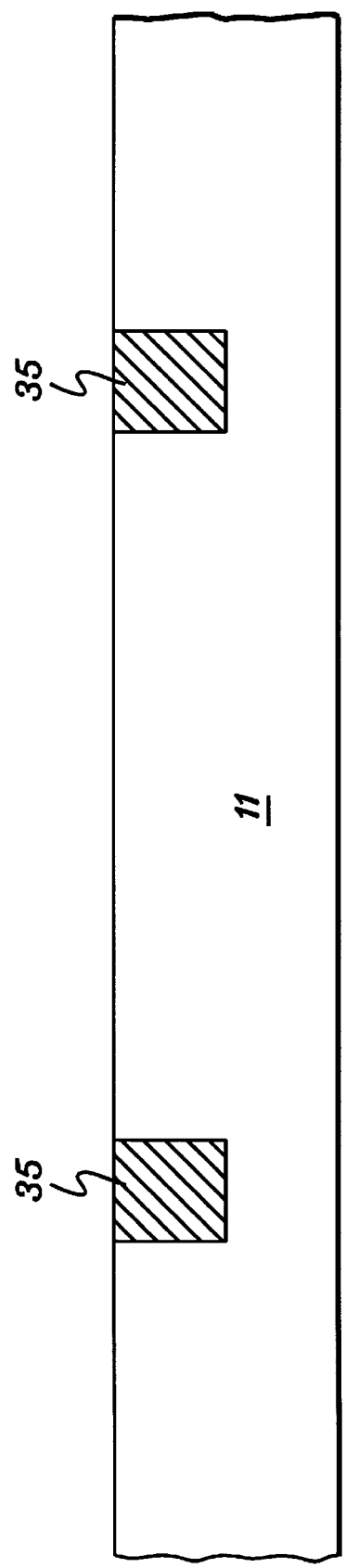

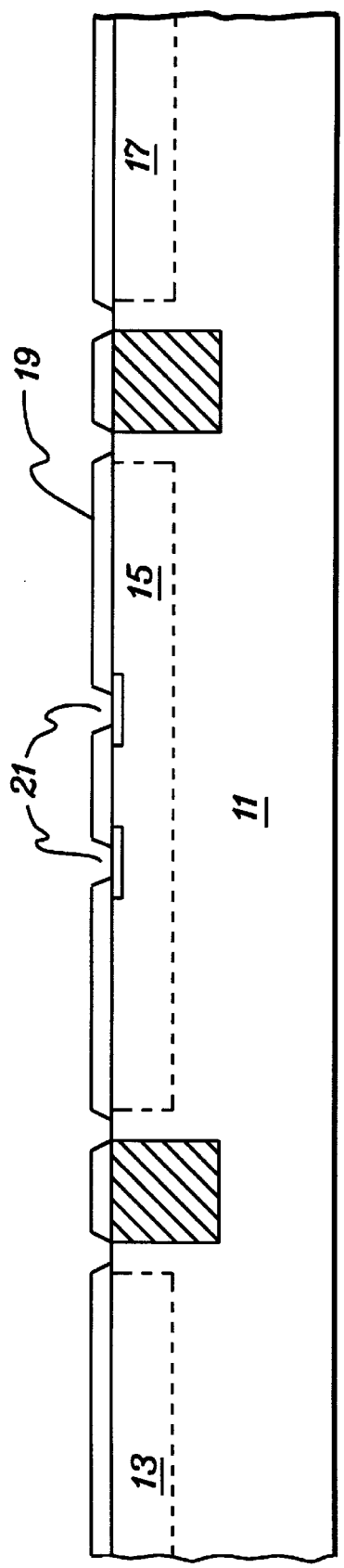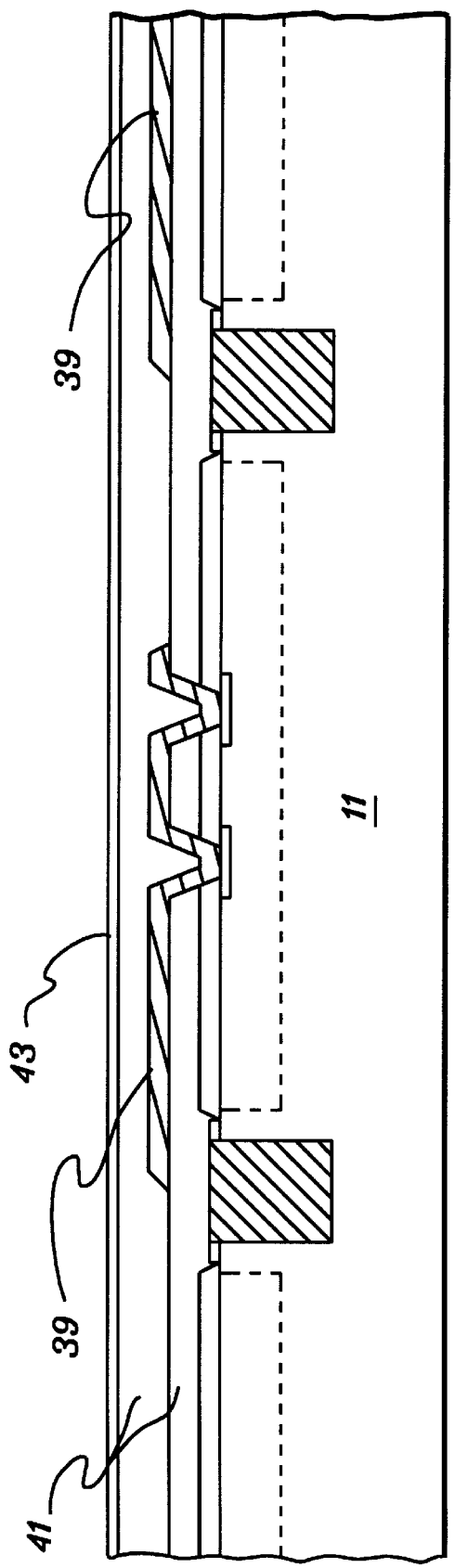

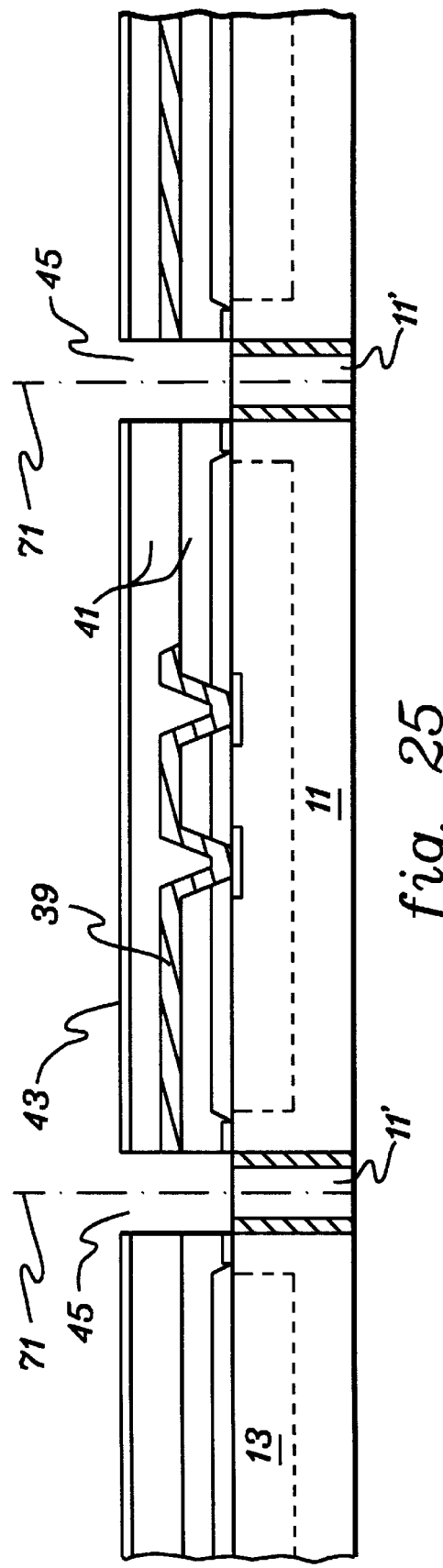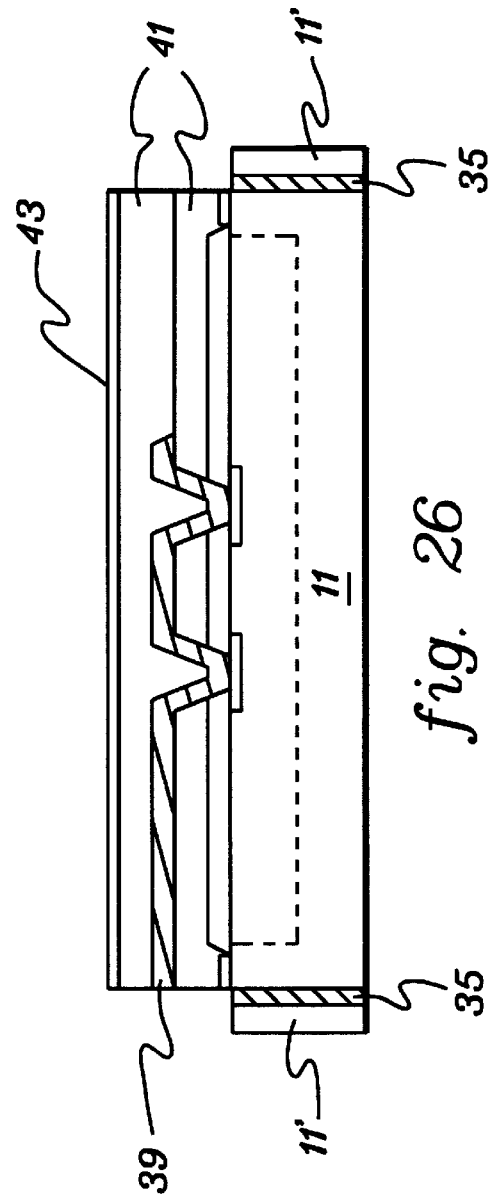

METHODS FOR PRECISE DEFINITION OF INTEGRATED CIRCUIT CHIP EDGES

This application is a division of application Ser. No. 08/507,186 filed Jul. 26, 1995 which application is now: U.S. Pat. No. 5,691,248.

TECHNICAL FIELD

The present invention relates in general to the fabrication of integrated circuit ("IC") chips. More specifically, the present invention relates to methods for precisely defining the edges of IC chips during wafer level fabrication and to the subsequent use of such IC chips in multichip electronic modules.

BACKGROUND OF THE INVENTION

Since the development of integrated circuit technology, computers and computer storage devices have been made from wafers of semiconductor material comprising a plurality of integrated circuits. After a wafer is made, the circuits are typically separated from each other by dicing the wafer into small chips. Thereafter, the individual chips are bonded to carriers of various types, interconnected by wires and are packaged. Such "two-dimensional" packages of chips fail to optimize the number of circuits that may be fabricated in a given space, and introduce undesirable signal delays, capacitance, and inductance as signals travel between chips.

Recently, three-dimensional arrays of chips have emerged as an important packaging approach. A typical multichip electronic module consists of multiple IC chips adhesively secured together as a monolithic structure. A metallization pattern is often provided directly on one (or more) side surface(s) of the module for IC chip interconnections and for electrical connection of IC chips to circuitry external to the module. The metallization pattern can include both individual contacts and bussed contacts. Multichip modules comprising stacks of IC chips are referred to herein as "stacks."

The current stack fabrication process suffers from problems that negatively affect overall stack manufacturing yield and efficiency. As a result, stack manufacturing costs remain high and profit margins remain low. Several of these problems involve: (1) IC chips becoming unusable in stacks due to edge chipping during wafer dicing; (2) difficult side-surface channel via fabrication; (3) side-surface polyimide edge bead thickness; and (4) variable T-connect quality. Each of these problems is discussed in further detail hereinbelow.

Edge Chipping

It is important to have very uniform edges on IC chips used in a stack. When IC chips are laminated into a stack, the edges of the IC chips define the stack's side-surface on which thin-film metal, necessary for chip interconnection, is deposited. To control defects, this thin-film processing requires a defect-free stack side-surface. Therefore, chip edge defects directly impact the ability to build the stack side-surface thin-film structures.

IC chip edge chipping results from conventional mechanical wafer dicing (i.e., sawing or laser cutting) through a thick polyimide layer and silicon substrate. As one prior solution, the wafer dicing process was operated at $\frac{1}{10}$th the typical dicing rate to minimize IC chip edge defects. This approach has met with minimal success as IC chip edge chipping still occurs. Furthermore, besides the extremely slow dicing rates employed, there is an expensive and time-consuming post dicing chip edge inspection process. The net yield of this conventional dicing process is unpredictable and ranges from, for example, 30 to 90%.

Channel Via Fabrication

T-connects are used to provide an electrical interface between each IC chip in a stack and the wiring on the stack side-surface. More specifically, the T-connects join transfer metal leads that extend from the electrical contacts on the surfaces of the IC chips to the edges of the IC chips that correspond to the side-surfaces of the stack. The current process for forming a T-Connect on the side-surface of the stack entails wet etching a channel via through a polyimide passivation layer disposed on the side-surface. This via must be accurately aligned, within a few microns, to the transfer metal leads extending to the edge of an IC chip and accordingly presented to the side-surface of the stack.

Due to the irregular IC chip sizes that result from conventional dicing processes, the alignment of the IC chips within the stack is such that the channel via etch must be individually performed for each chip in the stack (i.e., in a step and repeat fashion). The channel via alignment is critical because any misalignment results in an electrical short between the T-Connect pads and the grounded silicon substrate. Misaligned channel vias are detected in a post polyimide etch inspection process that further increasing stack build costs. If problems are detected, rework requires repolishing the side-surface of the stack which is yet another time-consuming and difficult process. Further, only a few side-surface reworks can be performed before the entire stack must be discarded. The critical alignment of channel vias is further complicated by the lack of alignment marks on the side-surface of the stack.

As a further problem, the stack side-surface polyimide layer is relatively thin, currently, for example, approximately 2 um. This facilitates etching the channel vias within the required tolerance. However, the thinness of the side-surface polyimide layer makes it more susceptible to stack side-surface defects including, for example, defect laden IC chip edges, polishing defects, contamination, etc. Thus, the chances for having a hole/defect in the polyimide which could result in an electrical short between a T-Connect pad and the silicon IC chip edge are increased.

Edge Bead

When the stack side-surface polyimide layer discussed above is applied, significant perimeter edge beads usually occur. These edge beads are large in both height and lateral dimensions. For example, edge beads can have heights 2–3 times (or greater) than the thickness of the applied polymeric layer and a lateral dimension of 500–1,000 um.

To adequately form (i.e., etch) the channel vias within the tight tolerance discussed above, the thickness of the side-surface polyimide layer must be uniform. If the thickness is not uniform due to edge beading, then the etch pattern will not meet the channel via tolerance. For example, nonuniform side-surface polyimide layer thickness results in a nonuniform channel via size. Certain parts of the channel via will be too small (i.e., not sufficiently removed), while other areas will be too large. The former results in polyimide being left over the end of the transfer metallurgy line and the inability to form an electrically conductive T-Connect, while the latter results in exposure of the silicon chip edge and an electrical short between the T-Connect pad and the silicon chip. In addition to the impact on the channel via formation, the large height variation of the edge bead precludes the formation of thin-film metallization features which require photolithographic definition, (e.g., stack side-surface wiring and T-Connect pads).

The current technique employed to avoid these problems is to "ground rule out" the edge bead area on the stack side-surface. This involves identification of the edge-bead area around the perimeter of the stack side-surface in which no photolithographic features (e.g., channel via or thin-film wiring/T-Connect pads) can be fabricated. Because an extensive area of the stack side-surface becomes unavailable, there is a decrease in the stack side-surface wiring density.

T-Connect Quality

Formation of an electrically good T-Connect depends upon the quality and cleanliness of the end of the transfer metal lead presented to the stack side-surface. It has been shown that stack side-surface polishing deposits material (e.g., polyimide flakes, polishing media and contaminants) on the end of the transfer metal lead such that the T-Connect electrical resistance/conductivity varies. Typical resistance may range from a complete open to a few ohms. Unfortunately, this contamination is unpredictable and cannot be easily visually detected (to date, only a Scanning Electron Microscope has been used to view the contamination). Therefore, one does not know whether there will be a T-Connect resistance problem on a specific stack until after the T-Connects have been deposited and a parametric electrical test performed. If a problem is found, the entire stack side-surface has to be reworked. As discussed hereinabove, there is a limit to the number of side-surface reworks possible before the entire stack must be discarded.

Beyond the problems discussed above, the current stack fabrication process requires much tighter dicing tolerance than is currently required for IC chip dicing associated with single IC chip, plastic encapsulation type packaging. The dicing tolerance for plastic packaging is approximately, for example, +/−20 um, while the stack process requires a dicing tolerance of approximately, for example, +/−5 um.

When IC chips of inadequate tolerance are stacked and laminated, the varying IC chip sizes result in IC chips shifting within the stack. Such shifting causes misalignment of, for example, the transfer metal leads of each IC chip in the stack. Accordingly, the side-surface of the stack requires polishing to expose all of the transfer metal leads, thereby reducing the total number of times that the stack side-surface. can be reworked. Furthermore, the misalignment of the IC chips results in wider side-surface wiring being required to 'capture' all the side-surface connections. Side-surface wiring density is therefore reduced.

As yet another problem, the varying IC chip sizes force the stack/lamination fixture used for assembly of the stack to be large enough to accommodate IC chips of varying sizes up to the maximum specification limit. This increases the opportunity for IC chip shifting. Moreover, the forces on the stack during lamination are concentrated on the largest chips in the stack because they are in direct contact with the lamination fixture. Therefore, these large chips tend to become damaged during lamination. This further compromises stack yield and requires increased side-surface polishing.

The present invention is directed toward solutions to the above discussed problems.

DISCLOSURE OF THE INVENTION

In a first aspect, the present invention includes a method for defining at least one edge of an integrated circuit ("IC") chip that comprises part of a wafer. The wafer has a first planar main surface and a second planar main surface. A portion of the second planar main surface of the wafer is parallel to a planar main surface of the IC chip.

The method includes lithographically creating a first trench in the wafer that intersects its first planar main surface. The first trench has a bottom. Further, the planar main surface of the IC chip is polished toward the bottom of the first trench to thin the IC chip such that the first trench defines the at least one edge of the IC chip.

As an enhancement, the method may include filling the first trench with an insulating material, prior to the polishing of the main surface of the IC chip. Also, a transfer metal layer may be formed above the first planar main surface of the wafer. The transfer metal layer is mechanically and electrically coupled to the IC chip. Thereafter, a second trench may be formed through the transfer metal layer and coincident with the first trench. The at least one edge of the IC chip is thus further defined and ends of transfer metal leads of the transfer metal layer are aligned with the at least one edge of the IC chip.

To separate the IC chip from the wafer, mechanical dicing may be performed along a path within, and collinear with, the first trench. After the mechanical dicing, a kerf comprising the insulating material is removed to expose the at least one edge of the IC chip.

In another aspect, the present invention includes another method for use in defining the at least one edge of the IC chip. The method includes lithographically creating a first trench in the wafer that intersects the first planar main surface of the wafer. Within the first trench, two insulating layers are formed. A first insulating layer has a surface comprising the at least one edge of the IC chip, while a second insulating layer comprising a removable kerf region. The method further includes thinning the IC chip from the planar main surface thereof to facilitate separation of the IC chip from the wafer and removal of the removable kerf region to define the at least one edge of the IC chip.

As enhancements, the method may include forming the first insulating layer as a conformal insulating layer on an interior surface of the first trench. The first insulating layer may have a lip extending out of the first trench and onto the first planar main surface of the wafer. Forming the second insulating layer may comprise filling remaining space inside the first trench with a second insulating material.

As in the previous aspect, a transfer metal layer may be formed above the first planar main surface of the wafer and a second trench formed therethrough. In this aspect, the second trench may be coincident with vertical interior portions of the first insulating layer within the first trench. The at least one edge of the IC chip is thus further defined and ends of transfer metal leads of the transfer metal layer are aligned with the at least one edge of the IC chip.

The method may further include removing the second insulating layer to separate the IC chip from the wafer and to define the at least one edge of the IC chip. This removal may comprise, as examples, a chemical removal process or a mechanical dicing process through the second insulating layer followed by a chemical removal of remaining second insulating layer on the at least one edge of the IC chip.

In yet another aspect, the present invention includes a method for defining the at least one edge of the IC chip. The method includes lithographically creating a first trench in the wafer that intersects the first planar main surface of the wafer. The first trench defines the at least one edge of the IC chip. Thereafter, an insulating layer is formed within the first trench.

The method continues with dicing the wafer along a path substantially parallel to the first trench and outside of the IC chip to form a kerf region between the first trench and the path. Thereafter, the kerf region and the insulating layer are removed to form the at least one edge of the IC chip.

As enhancements, the method may include thinning the wafer toward a bottom of the first trench to facilitate removing the IC chip from the wafer. Creating th e first trench may include lithographically creating a pair of first trenches. One trench defines the at least one edge of the IC chip, while another trench defines at least one edge of another, adjacent IC chip. Dicing may be performed along a path between the pair of first trenches.

Again, a transfer metal layer may be formed above the first planar main surface of the wafer, and a second trench formed therethrough. In this aspect, the second trench may be coincident with outer extents of the pair of first trenches.

In any of the above aspects, the method may be repeated to form a plurality of IC chips having the at least one edge. These chips may be stacked to form an electronic module.

In a further aspect, the present invention comprises a wafer segment that includes a planar group of at least one IC chip that has at least one edge surface. An insulating layer is disposed on the at least one edge surface to facilitate stacking of the wafer segment into an electronic module.

The present invention has many advantages and features associated with it. Very precise IC chip size and edge definition are provided according to the techniques disclosed herein. Stacking of IC chips with this precise size and edge definition is greatly enhanced. Specifically, precise alignment of the ends of the transfer metal leads of the individual IC chips of the stack results from the herein disclosed IC chip edge definition process. Stack side-surface processing is thereby performed with less rework and alignment steps than were conventionally required. Furthermore, in some aspects of the present invention, stack level side-surface insulating layer processing is eliminated. In summary, the principles of the present invention improve the overall efficiency and cost competitiveness of stack fabrication through the wafer level processing techniques disclosed herein.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIG. 1 is a cross-sectional view of a wafer after an intermediate stage in the production of an IC chip to be formed therefrom pursuant to an embodiment of the present invention;

FIG. 2 is a cross-sectional view of the wafer of FIG. 1 subsequent to the formation of trenches for defining edges of the IC chip according to one embodiment of the present invention;

FIG. 7 is a cross-sectional view of the wafer of FIG. 6 following the formation of a transfer metal layer in conformance with one embodiment of the present invention;

FIG. 8 is a cross-sectional view of the wafer of FIG. 7 after the definition of second trenches down to the previously formed trenches pursuant to an embodiment of the present invention;

FIG. 9 is a cross-sectional view of the wafer of FIG. 8 subsequent to thinning the wafer according to one embodiment of the present invention;

FIG. 10 is a cross-sectional view of the completed IC chip of the wafer of FIG. 9 having its edges precisely defined in conformance with an embodiment of the present invention;

FIG. 11 is a cross-sectional view of a stage of wafer fabrication prior to the formation of active circuitry, but following the formation of trenches for use in defining the edges of IC chips formed from the wafer pursuant to one embodiment of the present invention;

FIG. 12 is a cross-sectional view of the wafer of FIG. 11 after the formation of two insulating layers in each of the trenches in accordance with an embodiment of the present invention;

FIG. 16 is a cross-sectional view of a stage of wafer fabrication prior to the formation of active circuitry, but subsequent to the formation of trenches for use in defining the edges of IC chips formed from the wafer in conformance with an embodiment of the present invention;

FIG. 17 is a cross-sectional view of the wafer of FIG. 16 after the filling of the trenches with an insulating layer pursuant to one embodiment of the present invention;

FIG. 18 is a cross-sectional view of the wafer of FIG. 17 following the formation of active circuitry in accordance with an embodiment of the present invention;

FIG. 19 is a cross-sectional view of the wafer of FIG. 18 after the formation of a transfer metal layer in conformance with one embodiment of the present invention;

FIG. 25 is a cross-sectional view of the wafer of FIG. 24 after the formation of a transfer metal layer, formation of second trenches down to the sets of dual trenches and thinning of the wafer according to one embodiment of the present invention;

FIG. 26 is a cross-sectional view of an IC chip diced from the wafer of FIG. 25 in conformance with an embodiment of the present invention;

BEST MODE FOR CARRYING OUT THE INVENTION

Figure 3:
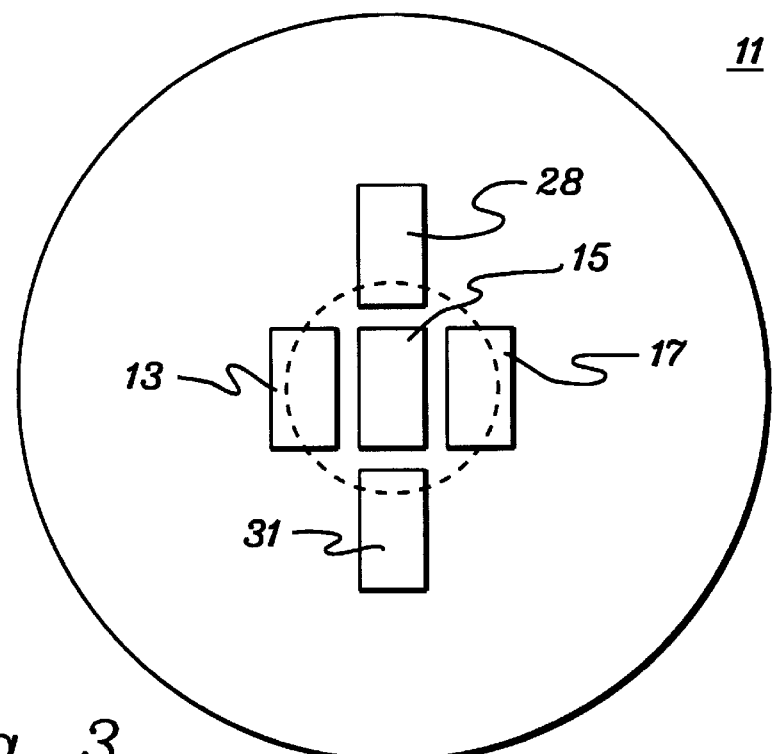
FIGS. 3–4 are top views of the wafer of FIG. 2 in conformance with an embodiment of the present invention.

The techniques of the present invention facilitate the formation of IC chips having precisely defined edges. The formation of stacks of such IC chips is therefore simplified as the precisely defined IC chip edges mitigate many problems associated with conventional stack fabrication techniques. As an example, stack 61 of FIG. 14 includes multiple IC chips 12 with edges defined according to the principles of one embodiment of the present invention. Transfer metal leads 39 of the IC chips 12 are precisely aligned with the side-surface of the stack and with the transfer metal leads 39 of the other IC chips in the stack. Furthermore, in this example, each IC chip 12 has side-surface insulation 35 preformed before stacking. Thus, as one advantage, stack 61 requires fewer process steps to form side-surface metallization and can accordingly be manufactured with higher yield and lower cost.

In a first embodiment of the present invention, the techniques disclosed herein begin with a wafer 11 (FIG. 1) having active circuitry regions 13, 15 and 17 formed therein. A patterned insulating layer 19 is disposed over the wafer (e.g., silicon nitride), and electrical contacts 21 are connected to active circuitry 15. Electrical contacts 21 provide contact points for the later formed transfer metal leads which provide electrical conductivity to the edges of the IC chips formed from the wafer. Separating active circuitry regions 13, 15 and 17 are kerf regions 23.

Fabrication of the structures of FIG. 1 is conventional and will be apparent to one of ordinary skill in the art. The term "IC chip" is used herein to refer to all structures associated with IC chips including, but not limited to, for example, the underlying substrate, active circuitry, portions of adjacent kerf regions, upper level insulation and wiring.

After the provisioning of the wafer of FIG. 1, trenches 25 are formed within kerf regions 23 of the wafer (FIG. 2). As one process example, a dry etch may be used to create trenches 25. This may comprise a photolithography step to define a mask and a subsequent Reactive Ion Etching ("RIE") process to form trenches 25. The trenches should extend below the active circuitry in the wafer to a predetermined depth corresponding to the desired thickness of the wafer after a below described wafer thinning step. For example, if the wafer is to be thinned to 100 μm, then trenches 25 should be at least 100 μm deep. Trench width should be slightly less than the width of the kerf region and is therefore dependent on the actual IC chips being fabricated. For example, if the kerf region is 300 μm wide, then trenches 25 could be 250 μm wide.

Figure 4:
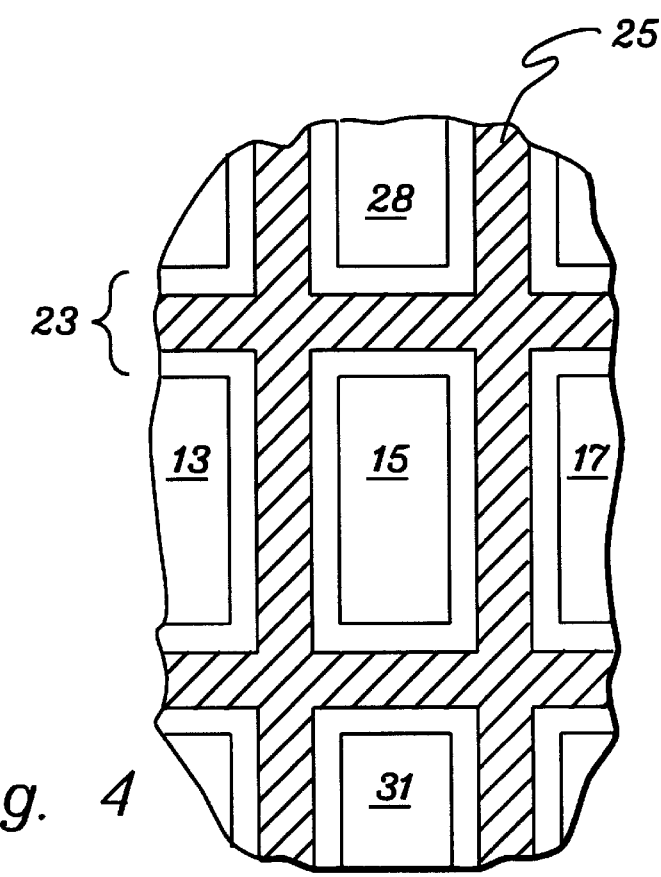

Active circuitry regions 13, 15 and 17 discussed above are shown along with active circuitry regions 28 and 31 in the top view of FIG. 3. More specifically, the enlarged region of FIG. 3 shown in FIG. 4 illustrates kerf regions 23 and trenches 25. Although in this example, trenches 25 surround all four edges of the IC chips of the wafer, this is not required. For example, if precise edge alignment is required on single edges of IC chips, then trenches on single sides of IC chips of the wafer would be defined. Similarly, if precise edge alignment on two or three IC chip edges is required, then trenches on two or three sides of IC chips of the wafer would be defined, respectively.

Figure 5:
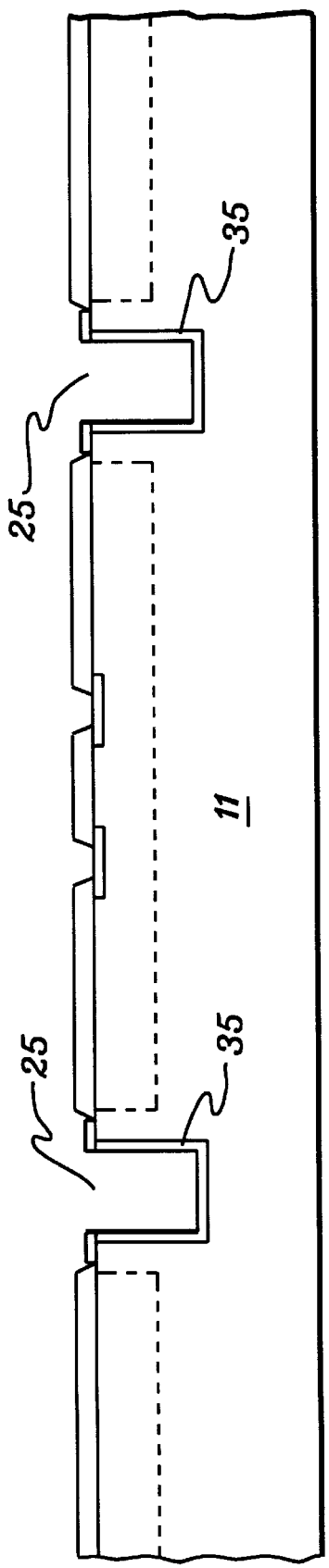
FIG. 5 is a cross-sectional view of the wafer of FIG. 2 subsequent to the deposition of an insulating layer in the trenches pursuant to one embodiment of the present invention.

To continue, an insulating layer 35 is formed within each of the previously formed trenches 25 (FIG. 5). More specifically, for example, a conformal layer of oxide 35 is formed within each trench 25 and has a lip slightly extending over the edge of the trench. A conventional thermal oxidation process may be used to form the oxide layer (oxide will not form over silicon nitride insulating layer 19). Oxide layer 35 will define the edges of each IC chip formed from the wafer.

Figure 6:
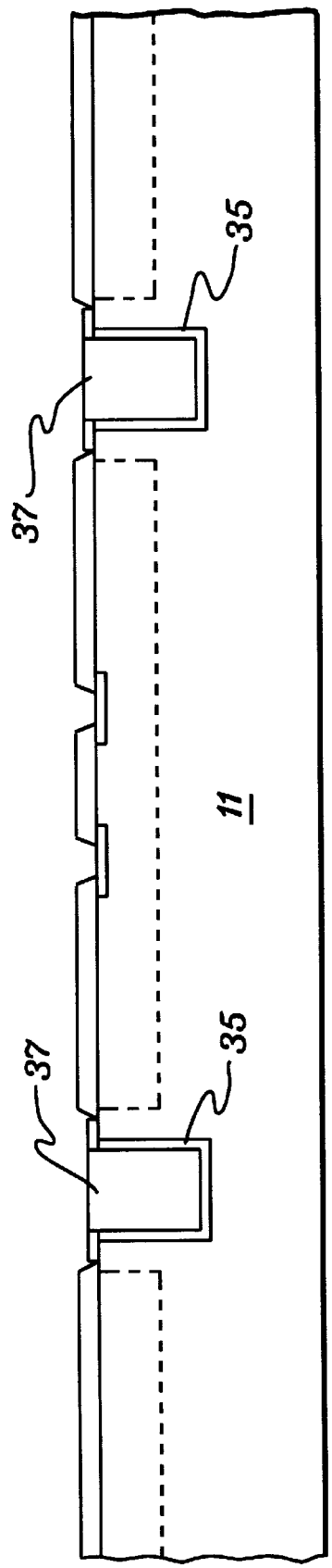
FIG. 6 is a cross-sectional view of the wafer of FIG. 5 after the filling of the trenches with an insulating material in accordance with an embodiment of the present invention.

In a following process step, trenches 25 are filled with a second insulating layer 37 (FIG. 6). Insulating layer 37 mechanically secures the IC chips to each other during later processing steps and may comprise, for example, polyimide or a mechanically rigid epoxy. Deposition thereof may be achieved by one of many available processes. Example processes include a masked Chemical Vapor Deposition ("CVD") process or a conformal layer deposition across the wafer with a subsequent polish back to patterned insulating layer 19.

Conventional Back End of the Line ("BEOL") processing is performed on the wafer to form a transfer metal layer comprising transfer metal leads 39 (FIG. 7). The transfer metal leads are composed of thin film wiring disposed between insulating layers 41. Further, an adhesive layer 43 is provided to facilitate bonding of the IC chips to each other when organized in a stack. As is well known, transfer metal leads 39 provide connectivity between electrical contacts 21 and the IC chip edge which will comprise the side-surface of a later formed stack including the IC chip. An example process used to form transfer metal leads 39 and associated insulating 41 and adhesive 43 layers may be found in "Polyimide Insulated Cube Package of Stacked Semiconductor Device Chips," filed Jun. 21, 1993, Docket Number FI9-92-053, which is incorporated by reference herein in its entirety.

Second trenches 45 (FIG. 8) are etched through transfer metal leads 39 and associated insulation 41 and adhesive 43 layers in further definition of the edges of the IC chips. Second trenches 45 are aligned with interior vertical surfaces of oxide layer 35. Accordingly, upon the separation of the individual IC chips from the wafer a precise edge with transfer metal leads 39 extending thereto is formed.

In a next process step, the back surface of wafer 11 is thinned using, for example, Chemical Mechanical Polishing ("CMP") or a wet etch (FIG. 9). However, CMP offers a unique advantage in that measures to protect the wafer from an aggressive chemical etching environment are not required. As process examples, CMP is described in "Chem-Mech Polishing Method for Producing Coplanar Metal/Insulator Films on a Substrate," U.S. Pat. No. 4,944,836, issued Jul. 31, 1990, which is incorporated by reference herein in its entirety, while a wet etch may be performed using a full face silicon wet etch comprising, for example, KOH in alcohol. Thinning is performed until the bottom of trenches 25 are exposed and more specifically, until second insulating layer 37 is revealed. Thus, after thinning, only second insulating layer 37 mechanically joins the IC chips of the wafer. Alternatively, thinning could be stopped before encountering the bottom of trenches 25 or insulating layer 37, however, additional backside processing would be required such as backside dicing using a saw blade wider than the trenches 25 or backside photo pattern, silicon etch and resist removal.

Following the wafer thinning process, the individual IC chips are separated from the wafer by removing insulating layer 37 which joins them (FIG. 10). As a process example, a mechanical removal process (i.e., doctor blade) followed by a oxygen ash can be used to remove layer 37 if it comprises either a polyimide or an epoxy. A chemical process tailored to selectively remove layer 37 may also be used to separate the IC chips.

As a further process example, the wafer may be mechanically diced using a conventional sawing or laser cutting process. Specifically, the dicing is performed along a path within second trenches 45 and through insulating layer 37 (FIG. 9). Subsequent thereto, each IC chip will have a portion of insulating layer 37 extending therefrom that is referred to herein as a kerf (for a similar example, see FIGS. 20–22 described hereinbelow). Using the same aforementioned oxygen ash processes, the remaining portion of insulating layer 37 is removed to produce a completed IC chip (FIG. 10).

Whatever the particular process used to remove insulating layer 37, the net result of the above described process is an IC chip having very uniform sizing and very well-defined edges. The IC chip size and edge alignments are defined within photolithographic tolerance, a significant advancement over previous mechanical dicing processes. Furthermore, the edges of the IC chips are insulated during wafer level processing thereby obviating the need for stack level side-surface insulation layer processing.

In another embodiment of the present invention, a process begins earlier in the wafer level processing sequence. Trenches 25 are defined in wafer 11 prior to the formation of active circuitry on the wafer (FIG. 11). As one example, conventional RIE processing may be used to form the trenches as discussed above with respect to FIG. 2.

Following the formation of trenches 25, the two insulating layers 35 and 37 are formed in trenches 25 (FIG. 12). The process for forming these insulating layers differs from that described above due to the lack of silicon nitride layer 19 (e.g., FIG. 2) at this stage of wafer processing. Furthermore, oxide and silicon nitride layers are used as insulating layers in this embodiment because they must withstand the high temperature processing that will follow to form the active circuitry. First, a conformal silicon nitride insulating layer 35 is deposited using, for example a CVD process. Thereafter, a thick conformal oxide layer 37 is deposited using, for example, a CVD process. CMP is then performed on the insulating layers using silicon nitride layer 35 as a polish stop. Lastly, a photolithography process is used to remove all remaining silicon nitride except that within trenches 25 and the "lip" on the surface of the wafer.

In alternate embodiments, the "lip" of silicon nitride layer 37 may be removed or recessed flush with the surface of wafer 11. If no lip is desired, the CMP described immediately hereinabove is continued through nitride layer 35 and stopped at the surface of the wafer. If a recessed lip is desired, a shallow trench is etched in addition to the deep trench 25. The shallow trench is sized to accommodate a recessed silicon nitride "lip." Silicon nitride layer 35 and oxide layer 37 are accordingly deposited and CMP is performed to the surface of wafer 11. Trenches with recessed lip insulator structures disposed therein accordingly result.

To continue with the process, the active circuitry is next formed on the IC chip (FIG. 6) using conventional wafer processing steps. Thereafter, the processes continue essentially as discussed above with regard to FIGS. 6–10 forming individual IC chips. As one process variation, the final dip/etch step used to remove insulating layer 37 will vary as this layer comprises an oxide rather than the previously employed polyimide or epoxy. Accordingly, a dilute hydrofluoric acid process may be used to remove oxide insulating layer 37. Individual IC chips with the above discussed advantages and characteristics are thus produced.

Figure 13:
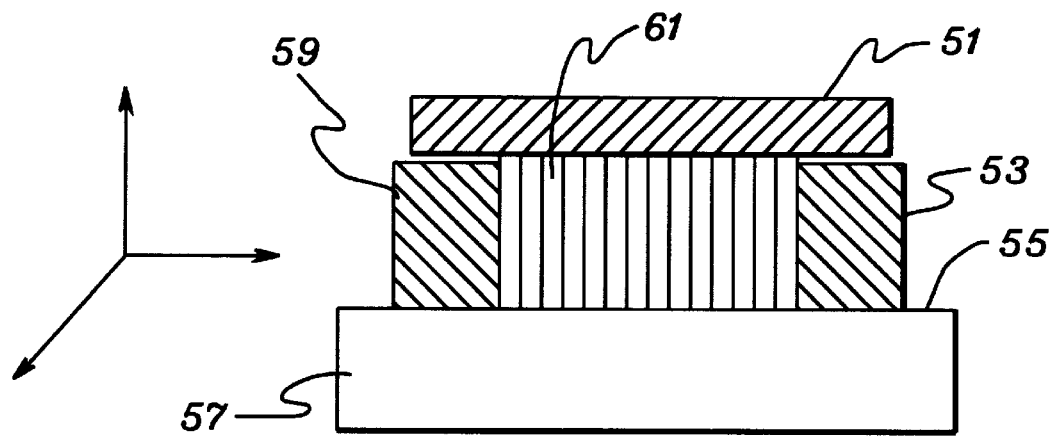
FIG. 13 is a cross-sectional view of a stack of IC chips in a fabrication fixture in conformance with one embodiment of the present invention.

Once the IC chips of the above described embodiments are fabricated, they may be incorporated into stacks of IC chips. The inherent uniformity of IC chip size, edge precision and transfer metal lead alignment facilitates simpler stack fabrication than was heretofore possible. An example IC chip stacking/alignment fixture is shown in FIG. 13. It is important that the stack side-surface to be wired is highly planar such that stack side-surface polishing is unnecessary. Therefore, a stack 61 is positioned within fixture guides 53 and 59 such that the side-surface of the stack to be wired rests on an optically flat surface 55 of a support 57. Only light pressure from a member 51 is necessary because the precise IC chip edge definition discussed hereinabove in combination with optically flat surface 55 results in a nearly self aligning stack.

Figure 14:
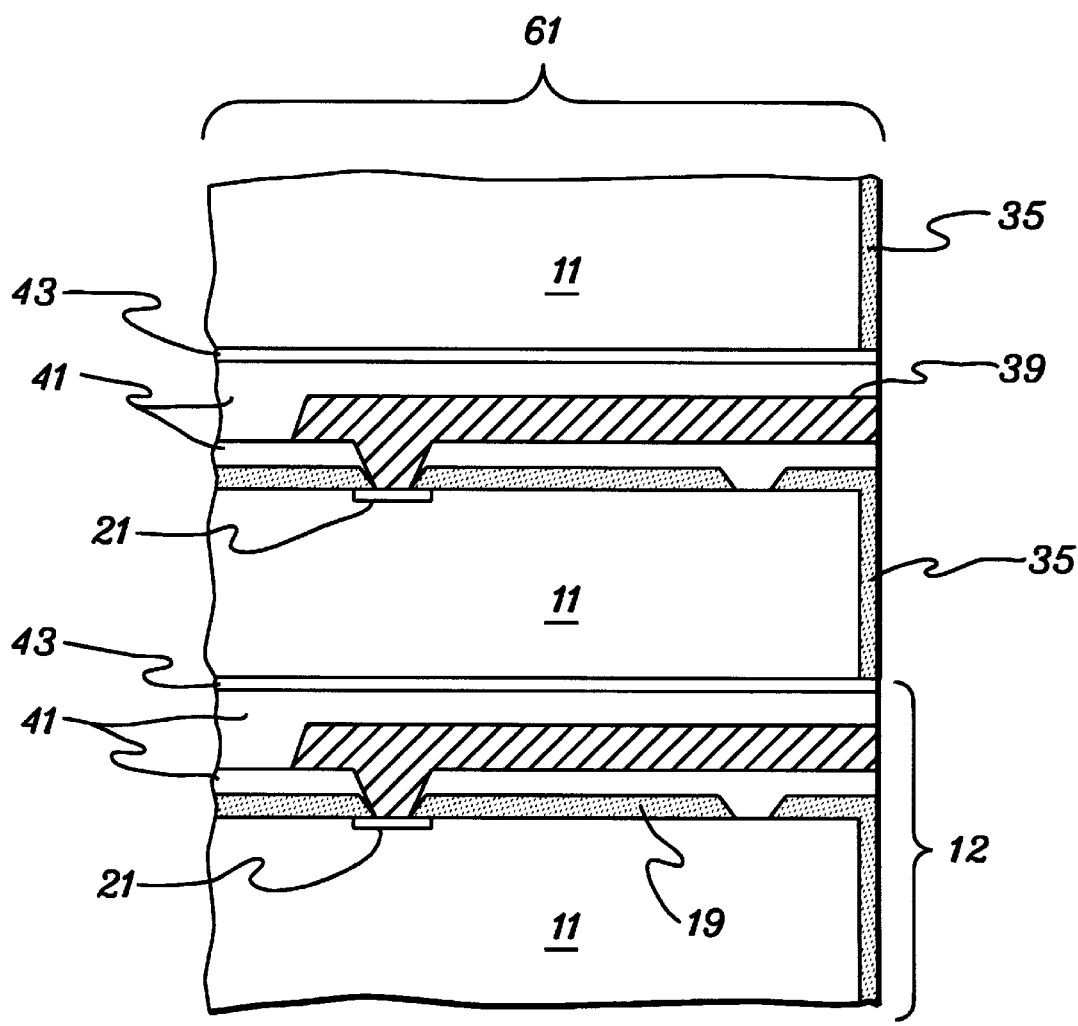
FIG. 14 is a cross-section view of the stack of FIG. 13 pursuant to an embodiment of the present invention.
Figure 15:
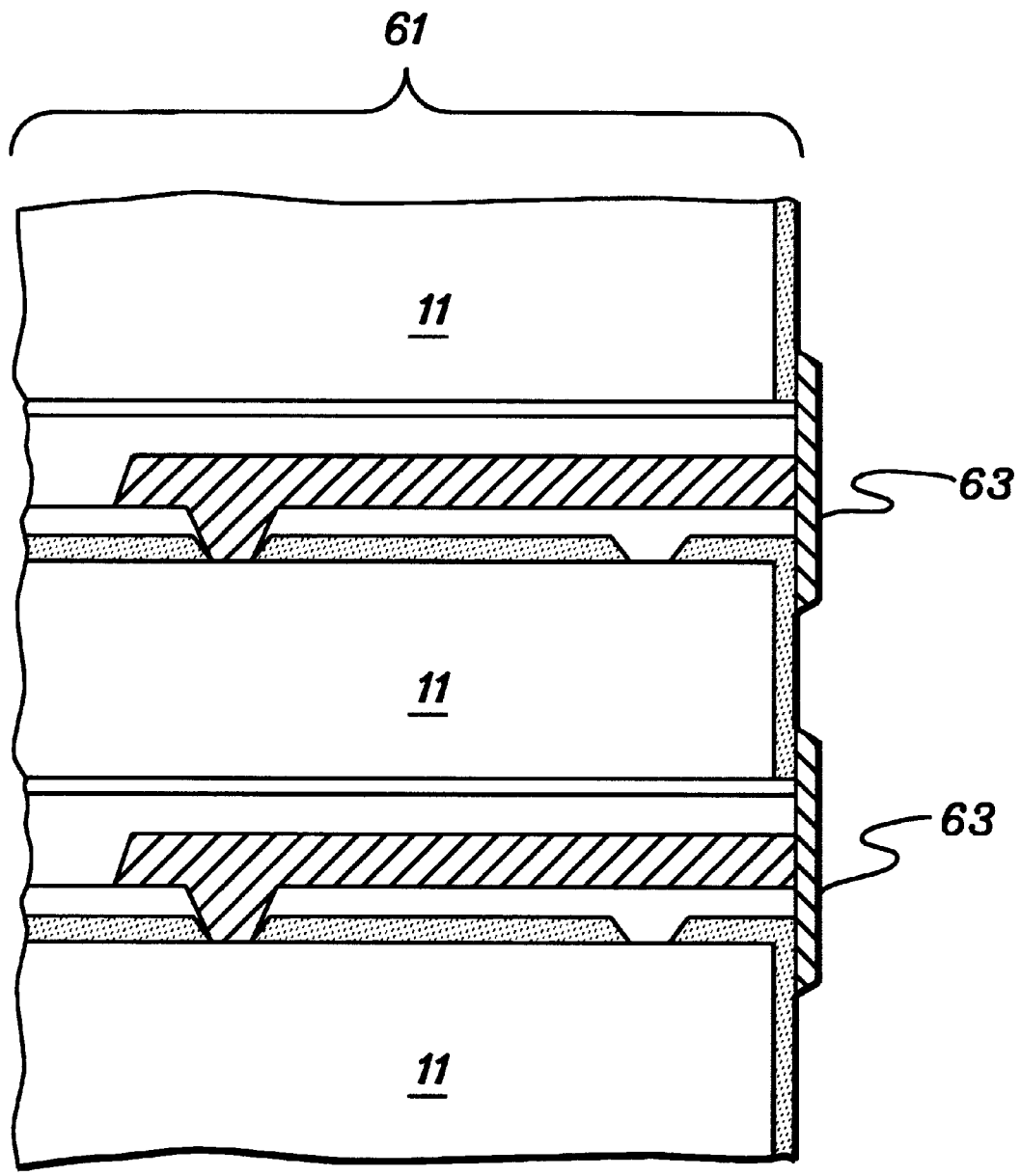
FIG. 15 is a cross-sectional view of the stack of FIG. 14 after the formation of side-surface metallization according to one embodiment of the present invention.

The laminated stack is shown in FIGS. 14–15. Side-surface metallization 63 used to interconnect the IC chips of the stack via their respective transfer metal leads 39 is fabricated directly on the side-surface of the stack 61. Conventional side surface processing to deposit insulating layers and open vias to the transfer metal leads is not necessary. Further, the alignment of the transfer metal leads of one chip to the adjacent chip(s) is within photolithographic tolerance in all directions. Thus, side-surface metallization may be fabricated with a much finer pitch than was previously possible because extra "width" in the side surface wiring is no longer necessary to capture misaligned transfer metal leads. Stack side-surface wiring density and corresponding stack functionality is therefore increased.

Further advantages of this structure include the elimination of the insulation beading on the side-surface of the stack because there is no stack level side-surface insulation layer deposition process. Therefore access is achieved to a significant area, heretofore not available. Photolithographically defined features may be formed in this new area including, for example, thin-film wiring and T-Connect pads. A significant increase in stack side-surface wiring density is accordingly achieved.

Stack manufacturing yield is significantly enhanced by the techniques of the above described embodiments. Specifically, the manufacturing yield losses due to the following conventional processes are eliminated:

1) yield loss due to mechanical dicing of IC chips;

2) yield loss due to stack side-surface channel via defects;

3) yield loss associated with chip edge defects resulting from using variable-sized chips in lamination;

4) yield loss associated with stack side-surface insulation layer defects; and 5) yield loss due to stack side-surface polishing defects.

Moreover, significant stack process thru-put and manufacturing efficiency benefits are realized including:

1) elimination of the mechanical dicing process and associated tight process tolerance;

2) elimination of the stack side-surface channel via definition and formation processes;

3) elimination of the stack side-surface insulator application processes;

4) elimination of the stack side-surface polishing processes;

5) elimination of the inspections associated with the aforementioned processes; and 6) elimination of rework processes associated with the aforementioned processes.

Thus, the overall quality, fabrication efficiency and cost efficiency of the stack fabrication process is enhanced.

As a variation on the above processes, individual groups of IC chips may be separated from a wafer using the techniques discussed hereinabove. For example, planar rows, columns, or arrays of IC chips may be separated from the wafer. Such planar rows, columns, or array or even a single chip are referred to herein as "wafer segments." Using the techniques disclosed herein, one edge surface to all of the edge surfaces of the wafer segments may have an insulation layer disposed thereon to facilitate stacking of the wafer segments into an electronic module. Stacking of wafer segments in general is discussed in "Method for Forming A Monolithic Electronic Module by Stacking Planar Arrays of Integrated Circuit Chips," by Cockerill et al., Ser. No. 08/293,991, filed Aug. 22, 1994, and incorporated herein by reference in its entirety. To note, when forming the trenches that define the edges of the wafer segment, trenches do not need to be formed in the kerf regions between the individual IC chips of the wafer segment since they remain together as part of the wafer segment.

In another embodiment of the present invention, IC chips with precise size and edge definition are fabricated, however without the inherent edge surface insulation layer (e.g., 35—FIG. 14) described above. Conventional side-surface insulation deposition and etching processes will therefore be needed for stack fabrication, but wafer level processing is less complex than in the above-described embodiments. The precise alignment of IC chips provided according to the principles of the present invention simplifies the associated conventional stack side-surface processing. Thus, the below described embodiments facilitate a simpler wafer fabrication process than is described above, which may be used with conventional, but simplified, stack side-surface processing.

The process begins similarly to previously described embodiments with the etching of trenches 25 in wafer 11 prior to the formation of active circuitry (FIG. 16). Etching may be performed by, for example, a mask/RIE process. The trenches are next filled with an insulating layer 35 (FIG. 17) comprising, for example, an oxide. The oxide may be formed by various individual processes including, for instance, thermal oxidation of the wafer to fill trenches 25 with oxide, followed by CMP of the surface of wafer 11 to remove oxide that is outside of trenches 25.

Figure 20:
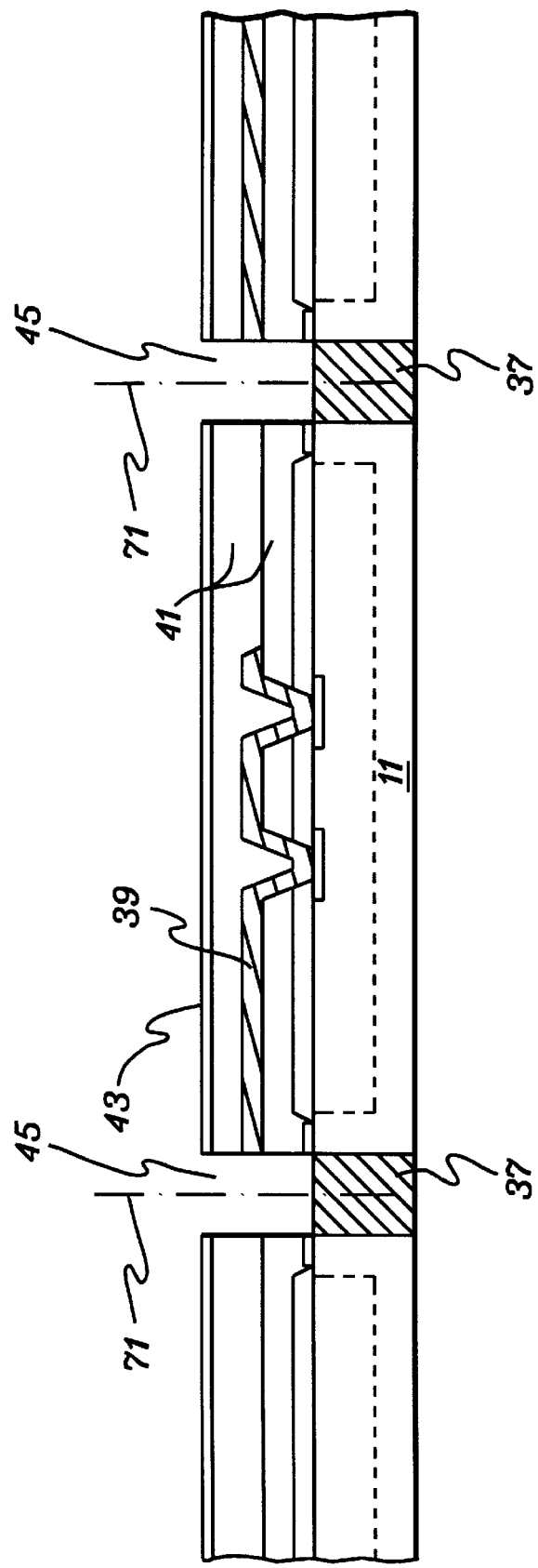
FIG. 20 is a cross-sectional view of the wafer of FIG. 19 subsequent to the formation of second trenches down to the previous trenches and thinning of the wafer pursuant to an embodiment of the present invention.

Active circuitry is then formed on the wafer using conventional processing (FIG. 18). In this example, active circuitry regions 13, 15 and 17 are formed along with electrical contacts 21 and patterned nitride insulating layer 19. BEOL processing is subsequently performed as discussed hereinabove to form transfer metal leads 39 and the associated insulating layers 41 and adhesive layer 43 (FIG. 19). Further, as discussed hereinabove, second trenches 45 are etched down to previously formed trenches 25 to facilitate separation of the individual IC chips of the wafer (FIG. 20). Thereafter, the wafer is thinned using, for example, CMP.

Figure 21:
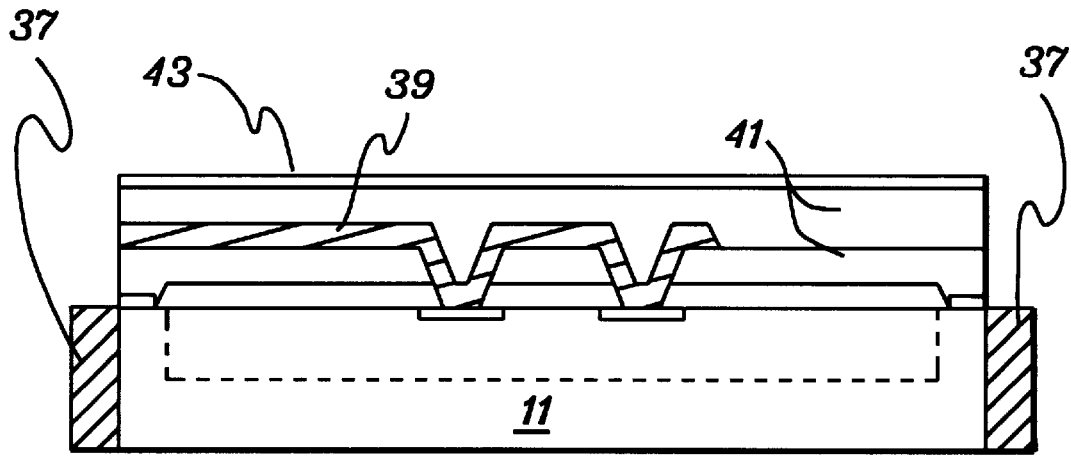
FIG. 21 is a cross-sectional view of an IC chip diced from the wafer of FIG. 20 according to one embodiment of the present invention.
Figure 22:
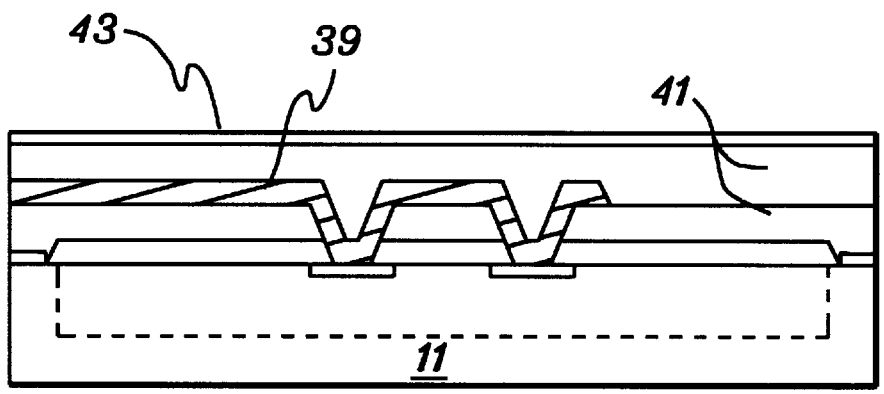
FIG. 22 is a cross-sectional view of the IC chip of FIG. 21 after the cleaning of the edge surfaces thereof in conformance with an embodiment of the present invention.

Wafer 11 is then mechanically diced using a conventional sawing or laser cutting process. Specifically, the dicing is performed through insulating layer 37 and along cutting path 71 which is collinear with the trenches (25 and 45). Thereafter, each IC chip will have a kerf of insulating layer 37 extending therefrom (FIG. 21). Using the same dip processes described hereinabove, the kerf of insulating layer 37 is removed to produce a completed IC chip (FIG. 22). For example, a dilute HF dip may be used to remove the remaining oxide kerf of insulating layer 37.

Figure 23:
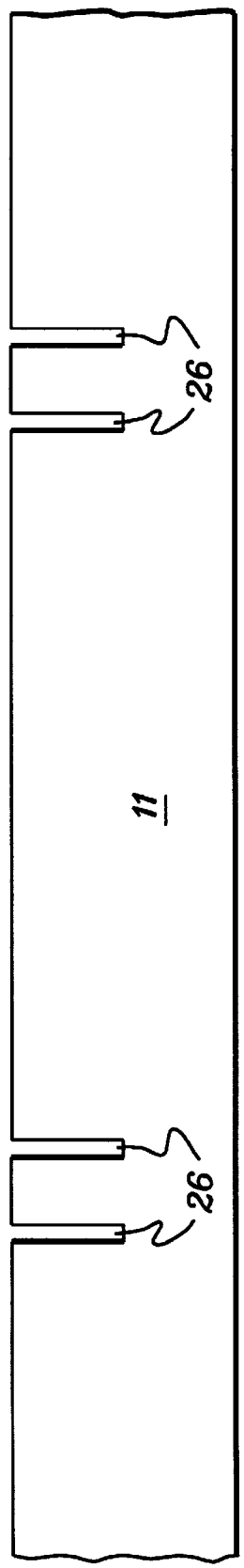
FIG. 23 is a cross-sectional view of a stage of wafer fabrication prior to the formation of active circuitry, but following the formation of sets of dual trenches therein for use in defining the edges of IC chips formed from the wafer pursuant to one embodiment of the present invention.
Figure 24:
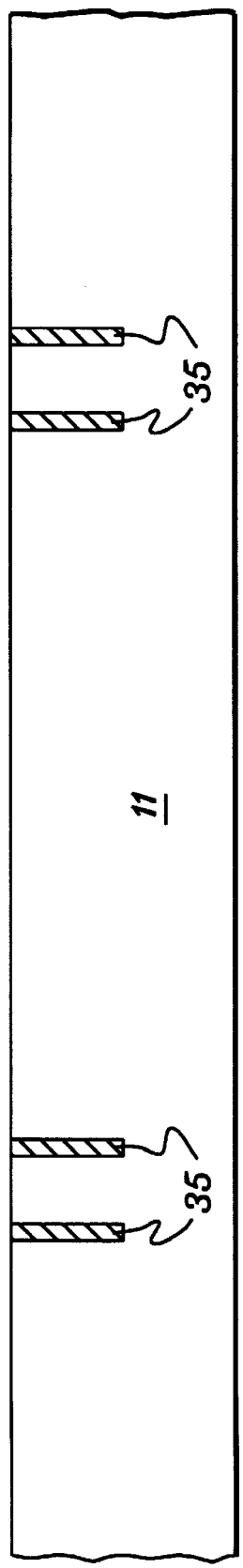
FIG. 24 is a cross-sectional view of the wafer of FIG. 23 after the filling of the sets of dual trenches with insulating material in accordance with an embodiment of the present invention.

In yet another embodiment of the present invention, the process for forming IC chips with precise edge alignment begins with the etching of sets of double trenches 26 in wafer 11 (FIG. 23). Each trench of the sets of double trenches is adjacent to the desired edge of each IC chip. The sets of double trenches 26 are filled with an insulator 35 (FIG. 24) comprising, for instance, an oxide. A thermal oxidation process may be used to fill the trenches 26 followed by a CMP polish to remove excess oxide as discussed hereinabove (e.g., FIG. 17).

Active circuitry regions 13, 15 and 17 and transfer metal leads 39 (FIG. 25) are subsequently formed using conventional processing. After that, second trenches 45 are etched through transfer metal leads 39 and associated insulating 41 and adhesive 43 layers and the wafer is thinned from the back surface, all as described hereinabove. Second trenches 45 are coincident with the outer sidewalls of trenches 26 as shown. The wafer is then mechanically diced using conventional sawing or laser cutting along path 71 that is parallel to and disposed between the trenches of the sets of double trenches to form individual IC chips (FIG. 26).

To complete the process, the remaining oxide insulator 35 and attached remaining silicon kerf 11' are removed using a dip process that will dissolve the oxide insulator 35. For example, a dilute HF dip may be used to remove the remaining oxide insulating layer 35 thereby causing the silicon kerf 11' to fall off. Separate IC chips are thereby produced (FIG. 22).

Other variations on the above described processes are possible. For example, each of the two processes described above (FIGS. 16–22 & FIGS. 23–26) could be modified whereby the trenches 25 and/or 26 could be formed after the formation of active circuitry on the wafer but prior to BEOL processing. The individual techniques for such processes will be apparent to one of ordinary skill in the art based upon the above disclosure.

Figure 27:
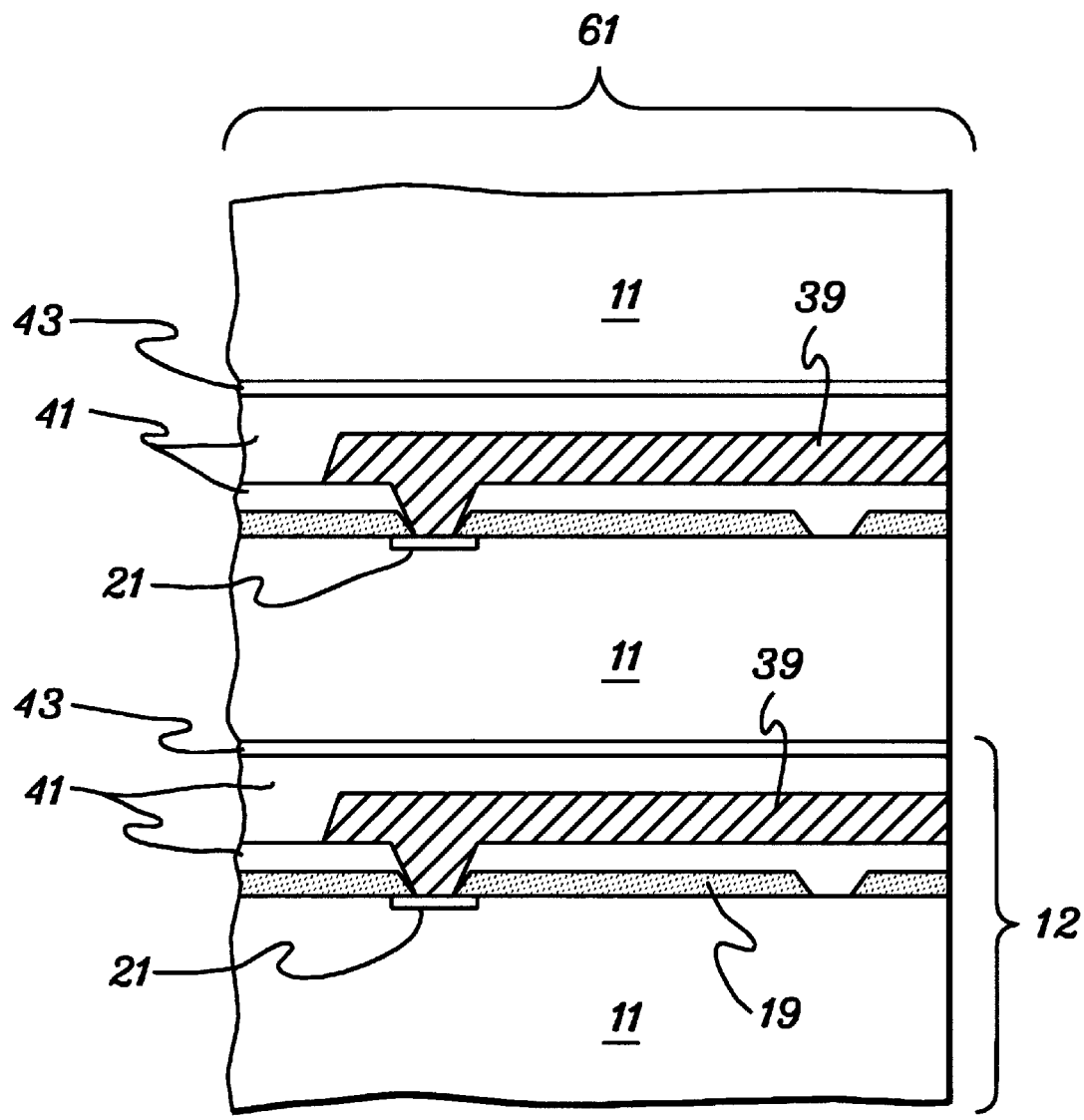
FIG. 27 is a cross-sectional view of a stack of the IC chips of FIG. 22 pursuant to one embodiment of the present invention.
Figure 28:
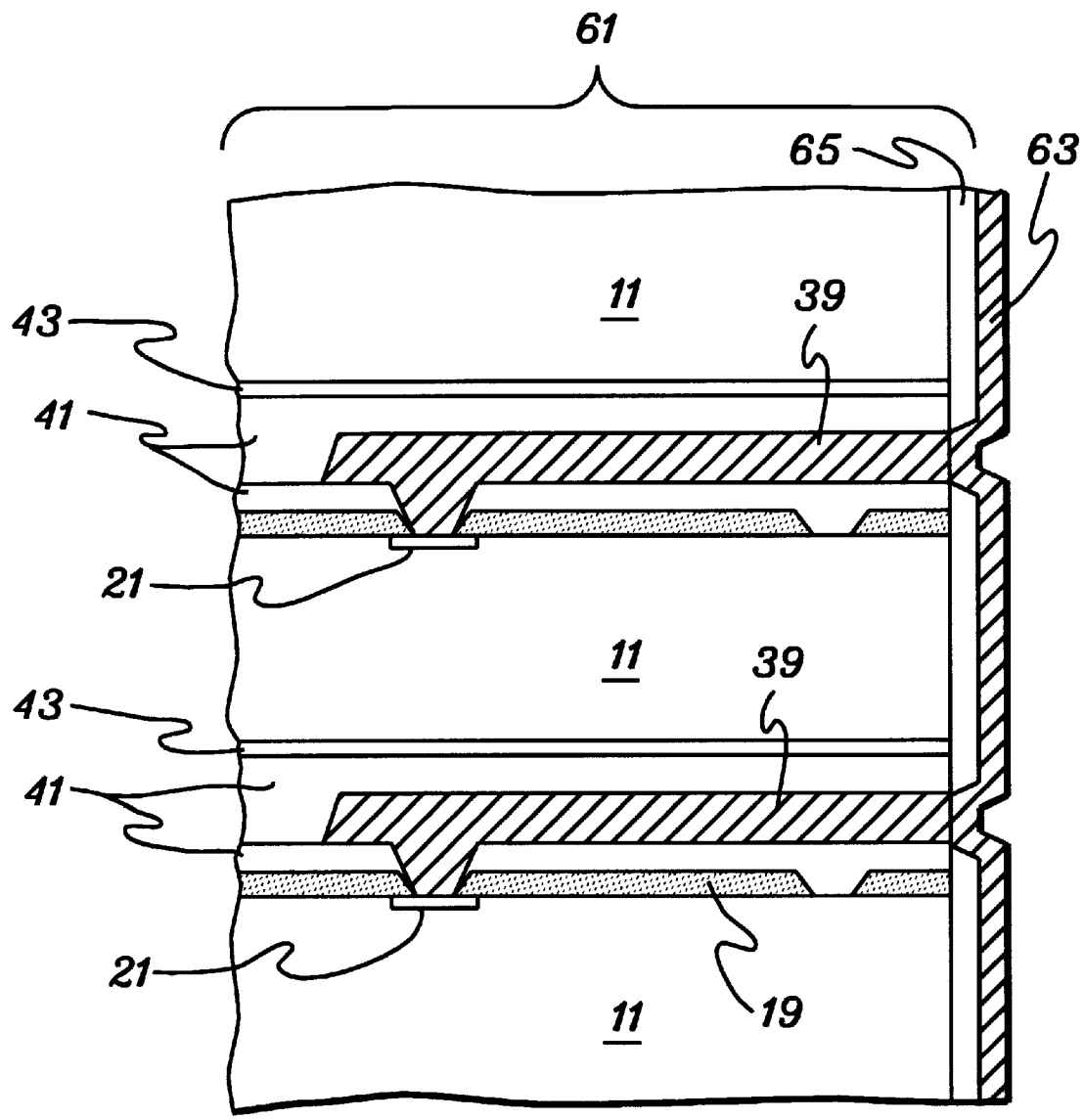
FIG. 28 is a cross-sectional view of the stack of FIG. 27 following the formation of side-surface wiring in accordance with an embodiment of the present invention.

The IC chips of, for example, FIG. 22 may be laminated into a stack 61 (FIG. 27). Alignment of the stack is facilitated by the precise IC chip 12 edge definition and sizing provided by the techniques of the present invention. The embodiments of FIGS. 16–26 do not inherently provide stack side-surface insulation as in the prior embodiments; however, the fabrication of such side-surface insulation 65 and associated wiring 63 (FIG. 28) is simplified by the precise IC chip alignment discussed hereinabove.

Advantageously, when initially stacked the side-surface to be wired will be highly planar and defect free. The ends of the transfer metal leads will be precisely aligned both between IC chips and relative to the stack. Thus, many of the polishing and alignment problems associated with side-surface thin film insulation and wiring are eliminated.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A wafer segment comprising:

a planar group of at least one IC chip, each IC chip including integrated circuitry, said planar group having a plurality of edge surfaces, at least one edge surface of said plurality of edge surfaces being spaced within a photolithographic tolerance from integrated circuitry of said at least one IC chip; and an insulating layer disposed on said at least one edge surface of said plurality of edge surfaces, said spacing within a photolithographic tolerance and said insulating layer facilitating stacking of said wafer segment into an electronic module, wherein said at least one edge surface forms a part of a side surface of said electronic module when said wafer segment is stacked as part of said electronic module.

2. The wafer segment of claim 1, wherein said planar grouping comprises a single IC chip.

3. The wafer segment of claim 1, wherein said planar grouping comprises a planar array of IC chips.

4. A wafer segment comprising:

a planar group of at least one IC chip, each IC chip including integrating circuitry, said planar group having a plurality of edge surfaces; and at least one edge surface of said plurality of edge surfaces being spaced within a photolithographic tolerance from integrated circuitry of said at least one IC chip, said spacing within said photolithographic tolerance facilitating stacking of said wafer segment into an electronic module, wherein said at least one edge surface forms a part of a side surface of said electronic module when said wafer segment is stacked as part of said electronic module.

* * * * *